(12) United States Patent
Uzu et al.

(10) Patent No.: US 10,333,016 B2
(45) Date of Patent: Jun. 25, 2019

(54) MULTI-JUNCTION PHOTOELECTRIC CONVERSION DEVICE AND PHOTOELECTRIC CONVERSION MODULE

(71) Applicant: Kaneka Corporation, Osaka (JP)

(72) Inventors: Hisashi Uzu, Osaka (JP); Masashi Hino, Osaka (JP); Mitsuru Ichikawa, Osaka (JP); Ryota Mishima, Osaka (JP); Tomomi Meguro, Osaka (JP); Kenji Yamamoto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 15/941,818

(22) Filed: Mar. 30, 2018

(65) Prior Publication Data

US 2018/0226529 A1    Aug. 9, 2018

Related U.S. Application Data

(63) Continuation of application No. PCT/JP2016/078953, filed on Sep. 29, 2016.

(30) Foreign Application Priority Data

Sep. 30, 2015 (JP) ................. 2015-194415

(51) Int. Cl.
*H01L 31/0725* (2012.01)
*H01G 9/20* (2006.01)
*H01L 51/44* (2006.01)
*H01L 31/028* (2006.01)

(52) U.S. Cl.
CPC ....... *H01L 31/0725* (2013.01); *H01G 9/2009* (2013.01); *H01L 31/028* (2013.01);
(Continued)

(58) Field of Classification Search
CPC ..... H01L 31/075; H01L 31/028; H01L 51/44; H01G 9/2009
(Continued)

(56) References Cited

U.S. PATENT DOCUMENTS

2007/0181179 A1  8/2007  Brabec et al.
2009/0272423 A1  11/2009  Niira et al.
(Continued)

FOREIGN PATENT DOCUMENTS

JP  2005-057251 A  3/2005
JP  2009-533878 A  9/2009
(Continued)

OTHER PUBLICATIONS

International Search Report issued in International Application No. PCT/JP2016/078953; dated Dec. 6, 2016 (2 pages).
(Continued)

*Primary Examiner* — Jayne L Mershon
(74) *Attorney, Agent, or Firm* — Osha Liang LLP

(57) ABSTRACT

A multi-junction photoelectric conversion device includes, in the following order from a light-receiving side: a first photoelectric conversion unit; an intermediate layer; and a second photoelectric conversion unit. The first photoelectric conversion unit includes: a first light absorbing layer comprising a perovskite-type crystal structure photosensitive material; a first charge transport layer on the light-receiving side of the first light absorbing layer; and a second charge transport layer on a rear side of the first light absorbing layer. The second charge transport layer is in contact with the intermediate layer. The second photoelectric conversion unit includes: a second light absorbing layer that is a crystalline silicon substrate; and a first conductive semiconductor layer that is in contact with the intermediate layer.

18 Claims, 3 Drawing Sheets

(52) U.S. Cl.
CPC ............ *H01L 51/44* (2013.01); *Y02E 10/549* (2013.01); *Y02P 70/521* (2015.11)

(58) Field of Classification Search
USPC ........................................................ 136/255
See application file for complete search history.

(56) References Cited

U.S. PATENT DOCUMENTS

| | | | |
|---|---|---|---|
| 2010/0313934 A1 | 12/2010 | Vaananen | |
| 2012/0080081 A1* | 4/2012 | Klein | ................... C23C 16/401 |
| | | | 136/255 |
| 2012/0266948 A1* | 10/2012 | Murata | ............... H01L 31/0747 |
| | | | 136/255 |
| 2015/0249170 A1* | 9/2015 | Snaith | ................... H01L 51/422 |
| | | | 136/256 |

FOREIGN PATENT DOCUMENTS

| | | |
|---|---|---|
| JP | 2010-272651 A | 12/2010 |
| JP | 2011-181608 A | 9/2011 |
| JP | 2011-249645 A | 12/2011 |
| JP | 2012-529760 A | 11/2012 |
| JP | 2014072327 A | 4/2014 |
| WO | 2014045021 A1 | 3/2014 |

OTHER PUBLICATIONS

Hodes, "Perovskite-Based Solar Cells" Science, vol. 342, Oct. 18, 2013, pp. 317-318 (2 pages).
Kojima et al., "Organometal Halide Perovskites as Visible-Light Sensitizers for Photovoltaic Cells" J. Am. Chem. Soc. 131, 6050-6051 (2009).
Mailoa et al., "A 2-terminal perovskite/silicon multijunction solar cell enabled by a silicon tunnel junction" Applied Physics Letters, 106, 121105 (2015) (5 pages).
International Preliminary Report on Patentability issued in International Application No. PCT/JP2016/078953; dated Apr. 12, 2018 (7 pages).
Office Action issued in Japanese Application No. 2017-543600, dated Mar. 12, 2019 (6 pages).

* cited by examiner

FIG. 2

| Bottom | AR layer thickness | | | | | | | | |
|---|---|---|---|---|---|---|---|---|---|
| | 10nm | 20nm | 30nm | 40nm | 50nm | 60nm | 70nm | 80nm | 100nm |
| 2.0 (n−1.0) | −2.2 | −3.2 | −4.4 | −5.4 | −6.2 | −6.6 | −7.0 | −7.2 | −7.9 |
| 2.2 (n−0.8) | −0.9 | −1.5 | −2.3 | −2.8 | −3.0 | −3.0 | −3.0 | −3.0 | −3.7 |
| 2.4 (n−0.6) | 0.0 | −0.2 | −0.5 | −0.6 | −0.5 | −0.1 | 0.2 | 0.2 | −0.6 |
| 2.5 (n−0.5) | 0.4 | 0.3 | 0.2 | 0.3 | 0.6 | 1.1 | 1.4 | 1.3 | 0.4 |
| 2.6 (n−0.4) | 0.6 | 0.7 | 0.8 | 1.0 | 1.6 | 2.1 | 2.3 | 2.2 | 1.1 |
| 2.8 (n−0.2) | 1.0 | 1.2 | 1.7 | 2.3 | 3.0 | 3.4 | 3.4 | 3.1 | 1.6 |
| 3.0 (n) | 1.1 | 1.4 | 2.0 | 2.8 | 3.3 | 3.6 | 3.4 | 2.9 | 1.2 |
| 3.2 (n+0.2) | 1.0 | 1.2 | 1.7 | 2.4 | 2.8 | 2.9 | 2.5 | 2.0 | 0.3 |
| 3.4 (n+0.4) | 0.7 | 0.8 | 1.1 | 1.5 | 1.7 | 1.6 | 1.2 | 0.5 | −1.0 |
| 3.5 (n+0.5) | 0.5 | 0.5 | 0.6 | 0.8 | 0.9 | 0.8 | 0.3 | −0.3 | −1.6 |
| 3.6 (n+0.6) | 0.3 | 0.1 | 0.1 | 0.1 | 0.0 | −0.2 | −0.6 | −1.0 | −2.2 |
| 3.8 (n+0.8) | −0.3 | −0.9 | −1.4 | −1.7 | −2.1 | −2.4 | −2.6 | −2.8 | −3.2 |
| 4.0 (n+1.0) | −1.0 | −2.1 | −3.1 | −3.9 | −4.5 | −4.8 | −4.7 | −4.4 | −4.2 |

(AR layer refractive index on vertical axis)

FIG. 3

| Top | AR layer thickness | | | | | | | | |
|---|---|---|---|---|---|---|---|---|---|
| | 10nm | 20nm | 30nm | 40nm | 50nm | 60nm | 70nm | 80nm | 100nm |
| 2.0 (n−1.0) | 0.1 | −0.3 | −0.7 | −1.1 | −1.5 | −1.8 | −1.9 | −1.9 | −1.7 |
| 2.2 (n−0.8) | −0.2 | −0.6 | −1.0 | −1.5 | −1.8 | −2.1 | −2.2 | −2.1 | −1.7 |
| 2.4 (n−0.6) | −0.4 | −0.8 | −1.2 | −1.7 | −2.1 | −2.2 | −2.3 | −2.1 | −1.6 |
| 2.5 (n−0.5) | −0.5 | −0.9 | −1.4 | −1.8 | −2.1 | −2.3 | −2.2 | −2.1 | −1.5 |
| 2.6 (n−0.4) | −0.5 | −0.9 | −1.4 | −1.8 | −2.1 | −2.3 | −2.2 | −2.1 | −1.4 |
| 2.8 (n−0.2) | −0.6 | −1.0 | −1.4 | −1.8 | −2.1 | −2.1 | −2.1 | −1.8 | −1.1 |
| 3.0 (n) | −0.6 | −0.9 | −1.4 | −1.8 | −2.0 | −1.9 | −1.7 | −1.4 | −0.9 |
| 3.2 (n+0.2) | −0.5 | −0.9 | −1.2 | −1.5 | −1.7 | −1.5 | −1.3 | −1.1 | −0.7 |
| 3.4 (n+0.4) | −0.4 | −0.7 | −1.0 | −1.2 | −1.2 | −1.1 | −0.9 | −0.7 | −0.5 |
| 3.5 (n+0.5) | −0.4 | −0.6 | −0.8 | −1.0 | −1.0 | −0.9 | −0.8 | −0.6 | −0.5 |
| 3.6 (n+0.6) | −0.3 | −0.5 | −0.7 | −0.8 | −0.8 | −0.7 | −0.6 | −0.5 | −0.4 |
| 3.8 (n+0.8) | −0.2 | −0.2 | −0.3 | −0.4 | −0.4 | −0.4 | −0.3 | −0.2 | −0.2 |
| 4.0 (n+1.0) | 0.1 | 0.1 | 0.1 | 0.1 | 0.1 | 0.0 | −0.1 | −0.1 | −0.1 |

(AR layer refractive index on vertical axis)

FIG. 4

| Current difference (mA/cm²) | AR layer thickness | | | | | | | | |
|---|---|---|---|---|---|---|---|---|---|
| | 10nm | 20nm | 30nm | 40nm | 50nm | 60nm | 70nm | 80nm | 100nm |
| 2.0 (n−1.0) | 1.8 | 1.8 | 2.0 | 2.1 | 2.1 | 2.1 | 2.2 | 2.2 | 2.4 |
| 2.2 (n−0.8) | 1.5 | 1.5 | 1.6 | 1.6 | 1.6 | 1.5 | 1.5 | 1.5 | 1.7 |
| 2.4 (n−0.6) | 1.3 | 1.3 | 1.3 | 1.2 | 1.1 | 1.0 | 1.0 | 1.0 | 1.2 |
| 2.5 (n−0.5) | 1.3 | 1.2 | 1.1 | 1.1 | 0.9 | 0.8 | 0.8 | 0.8 | 1.1 |
| 2.6 (n−0.4) | 1.2 | 1.1 | 1.0 | 0.9 | 0.8 | 0.7 | 0.7 | 0.7 | 1.0 |
| 2.8 (n−0.2) | 1.2 | 1.0 | 0.9 | 0.7 | 0.6 | 0.5 | 0.5 | 0.6 | 1.0 |
| 3.0 (n) | 1.1 | 1.0 | 0.9 | 0.7 | 0.6 | 0.5 | 0.6 | 0.7 | 1.1 |
| 3.2 (n+0.2) | 1.2 | 1.1 | 0.9 | 0.8 | 0.7 | 0.7 | 0.8 | 0.9 | 1.2 |
| 3.4 (n+0.4) | 1.2 | 1.2 | 1.1 | 1.0 | 0.9 | 1.0 | 1.1 | 1.2 | 1.5 |
| 3.5 (n+0.5) | 1.3 | 1.2 | 1.2 | 1.1 | 1.1 | 1.1 | 1.2 | 1.3 | 1.6 |
| 3.6 (n+0.6) | 1.3 | 1.3 | 1.3 | 1.3 | 1.3 | 1.3 | 1.4 | 1.5 | 1.7 |
| 3.8 (n+0.8) | 1.4 | 1.5 | 1.6 | 1.6 | 1.7 | 1.7 | 1.8 | 1.8 | 1.9 |
| 4.0 (n+1.0) | 1.6 | 1.8 | 1.9 | 2.0 | 2.1 | 2.1 | 2.1 | 2.1 | 2.0 |

(AR layer refractive index)

MULTI-JUNCTION PHOTOELECTRIC CONVERSION DEVICE AND PHOTOELECTRIC CONVERSION MODULE

TECHNICAL FIELD

One or more embodiments of the present invention relate to a multi-junction photoelectric conversion device and a photoelectric conversion module.

BACKGROUND

A photoelectric conversion device utilizing an organic metal perovskite-type crystal material (perovskite photoelectric conversion device) can provide a high conversion efficiency, and a large number of reports have recently been published on improvement on conversion efficiency (e.g., Non-Patent Document 1 and Patent Document 1). Example of the organic metal includes a compound represented by a general formula $RNH_3MX_3$ or $HC(NH_2)_2MX_3$ (where R is an alkyl group, M is a divalent metal ion, and X is a halogen). Spectral sensitivity characteristics of the compound are known to vary depending on the halogen and/or the ratio of the halogen (e.g., Non-Patent Document 2).

A perovskite-type crystal material, such as $CH_3NH_3PbX_3$ (X: halogen), can be formed by a vapor deposition, spin coating and the like. Especially a thin-film can be formed in low cost with using a solution coating method such as spin coating. Thus, attention has been directed to a perovskite photoelectric conversion device as a low-cost and high-efficiency next generation photoelectric conversion device.

For example, a perovskite-type crystal material using iodine as a halogen has a spectral sensitivity characteristic at a wavelength shorter than a wavelength of 800 nm, and absorbs little infrared light having a wavelength longer than 800 nm. Thus, for improvement of the conversion efficiency of a photoelectric conversion device including a perovskite-type crystal material, it is important to effectively utilize long-wavelength light which is absorbed only in a small amount by the perovskite-type crystal material.

For example, Non-Patent Document 3 discloses a double-junction solar cell in which on a crystalline silicon photoelectric conversion unit including a p-type emitter layer on a light-receiving side surface of an n-type single-crystalline silicon substrate, a perovskite photoelectric conversion unit is provided with an n-type tunnel junction layer and a $TiO_2$ layer interposed therebetween, and a crystalline silicon photoelectric conversion unit and a perovskite photoelectric conversion unit are connected in series.

PRIOR ART DOCUMENTS

Patent Documents

Patent Document 1: JP 2014-72327 A

Non-patent Documents

Non Patent Document 1: G. Hodes, *Science*, 342, 317-318 (2013).
Non Patent Document 2: A. Kojima et. al., *J. Am. Chem. Soc.*, 131, 6050-6051 (2009).
Non Patent Document 3: J. P. Mailoa et al., APPLIED PHYSICS LETTERS 106, 121105 (2015)

Non-Patent Document 3 suggests that by providing an n-type silicon tunnel junction layer between a p-type silicon emitter layer that forms a crystalline silicon photoelectric conversion unit and a $TiO_2$ layer that forms a perovskite photoelectric conversion unit, a favorable electrical junction is formed between the two photoelectric conversion units. On the other hand, the double-junction solar cell in Non-Patent Document 3 has a low short-circuit current density Jsc, and cannot sufficiently exhibit the effect of improving light utilization efficiency by multi-junction.

SUMMARY

In view of the situations described above, one or more embodiments of the present invention provide a high-efficiency photoelectric conversion device in which a perovskite photoelectric conversion unit is combined with a crystalline silicon-based photoelectric conversion unit.

The present inventors have extensively conducted studies, and resultantly found that by providing a specific intermediate layer between a perovskite photoelectric conversion unit and a crystalline silicon-based photoelectric conversion unit, the conversion efficiency of a multi-junction photoelectric conversion device can be improved.

A multi-junction photoelectric conversion device of one or more embodiments of the present invention includes a first photoelectric conversion unit, an intermediate layer and a second photoelectric conversion unit in this order from the light-receiving side. The first photoelectric conversion unit contains a perovskite-type crystal structure photosensitive material as a light absorbing layer ("first light absorbing layer"), and includes a first charge transport layer on the light-receiving side of the light absorbing layer, and a second charge transport layer on the rear side of the light absorbing layer. The second charge transport layer is in contact with the intermediate layer. The second photoelectric conversion unit includes a crystalline silicon substrate as a light absorbing layer ("second light absorbing layer"), and a first conductive semiconductor layer that is in contact with the intermediate layer.

A refractive index n1 of the second charge transport layer, a refractive index n2 of the first conductive semiconductor layer, and an average refractive index n of the intermediate layer satisfy the relationships of n1<n<n2, n2−n1≥0.7 and $\sqrt{(n1 \times n2)}-0.5 \leq n \leq \sqrt{(n1 \times n2)}+0.5$. The average refractive index n of the intermediate layer may be 2.0 to 3.5. The thickness of the intermediate layer may be 40 to 80 nm. The product of the average refractive index n of the intermediate layer and the thickness may be 100 to 300 nm.

The balance of the photocurrents of the photoelectric conversion units can be adjusted by providing a specific intermediate layer between a perovskite photoelectric conversion unit and a crystalline silicon-based photoelectric conversion unit, so that the efficiency of a multi-junction photoelectric conversion device can be improved.

BRIEF DESCRIPTION OF THE DRAWINGS

FIG. 2 depicts Table 1, which demonstrates that the refractive index n and the thickness d of an intermediate layer may influence the current density of the heterojunction conversion unit of one or more embodiments of the present invention.

FIG. 3 depicts Table 2, which demonstrates that the refractive index n and the thickness d of an intermediate layer may influence the current density of the perovskite photoelectric conversion unit of one or more embodiments of the present invention.

FIG. 4 depicts Table 3. which demonstrates that the refractive index n and the thickness d of an intermediate layer may influence the difference in current density between the heterojunction conversion unit and the perovskite photoelectric conversion unit of one or more embodiments of the present invention.

DETAILED DESCRIPTION OF THE EMBODIMENTS

Figure 1:
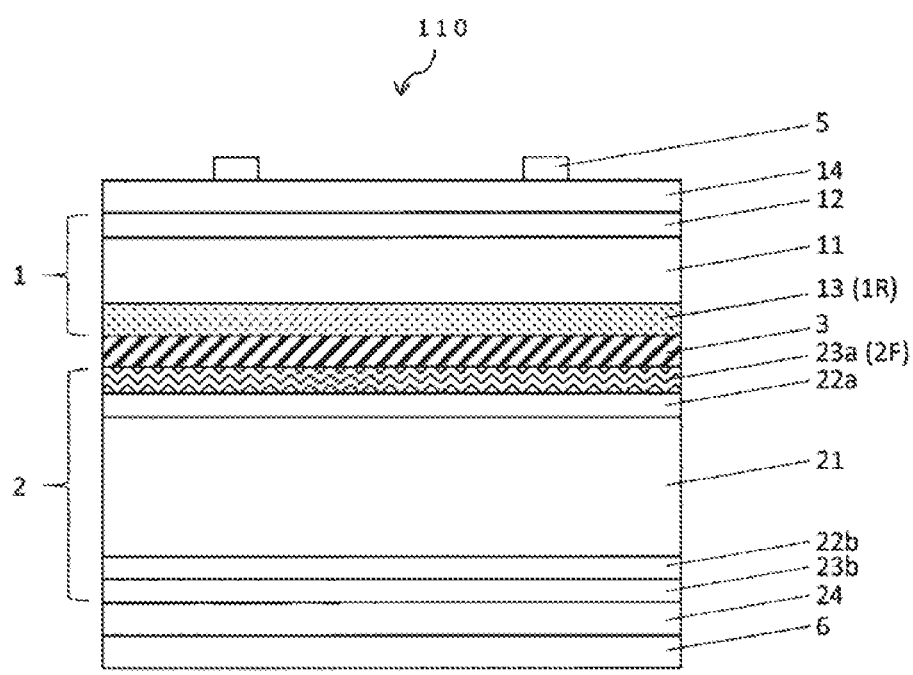
FIG. 1 is a schematic sectional view showing a configuration of a multi-junction photoelectric conversion device according to one embodiment.

FIG. 1 is a schematic sectional view of a multi-junction photoelectric conversion device according to one or more embodiments of the present invention. The multi-junction photoelectric conversion device 110 in FIG. 1 includes a light-receiving surface metal electrode 5, light-receiving surface transparent electroconductive layer 14, a first photoelectric conversion unit 1, an intermediate layer 3, a second photoelectric conversion unit 2, a rear surface transparent electroconductive layer 24 and a rear surface metal electrode 6, in this order from the light-receiving side. The first photoelectric conversion unit 1 contains a perovskite-type crystal structure photosensitive material as a light absorbing layer 11 ("first light absorbing layer"). The second photoelectric conversion unit contains a crystalline silicon substrate as a light absorbing layer 21 ("second light absorbing layer").

Crystalline silicon that is used for the light absorbing layer 21 of the second photoelectric conversion unit 2 has a bandgap narrower than that of the perovskite crystal material used for the light absorbing layer 11 of the first photoelectric conversion unit 1. By disposing the second photoelectric conversion unit having a narrow bandgap on the rear side of the first photoelectric conversion unit, long-wavelength light, which is not absorbed by the first photoelectric conversion unit, of light incident from the light-receiving surface (first photoelectric conversion unit side), can be utilized in the second photoelectric conversion unit, and therefore a multi-junction photoelectric conversion device with an excellent light utilization efficiency can be obtained.

The first photoelectric conversion unit 1 may be prepared by a wet process. Therefore, it may be possible that the multi-junction photoelectric conversion device 110 shown in FIG. 1 is manufactured by forming the intermediate layer 3 and the first photoelectric conversion unit 1 on the second photoelectric conversion unit 2.

(Second Photoelectric Conversion Unit)

The second photoelectric conversion unit 2 includes a crystalline silicon substrate as the light absorbing layer 21. The crystalline silicon may be either single-crystalline silicon or polycrystalline silicon. In particular, a single-crystalline silicon substrate may be used as the light absorbing layer 21 because it has high long-wavelength light utilization efficiency, and is excellent in carrier recovery efficiency.

Examples of the photoelectric conversion unit using a single-crystalline silicon substrate include: diffusion-type crystalline silicon photoelectric conversion unit in which an n-type layer is provided on the light-receiving side, and a high-doped region (p+ region) is disposed in rear of a p-type single-crystalline silicon substrate; and heterojunction photoelectric conversion unit in which an amorphous silicon-based thin-film is provided on a p-type or n-type single-crystalline silicon substrate. In particular the second photoelectric conversion unit may be a heterojunction silicon photoelectric conversion unit from the viewpoint of high conversion efficiency.

The second photoelectric conversion unit 2 includes a first conductive semiconductor layer as an outermost surface layer 2F on the light-receiving side, which is in contact with the intermediate layer 3. The conductive semiconductor layer may be a thin-film formed by a CVD method or the like, or a doped layer with a dopant diffused on a surface of a silicon substrate by means of thermal diffusion or the like.

In the multi-junction photoelectric conversion device shown in FIG. 1, the second photoelectric conversion unit 2 is a heterojunction photoelectric conversion unit in which a first conductive silicon-based thin-films 23a is disposed on a light-receiving side of a conductive single-crystalline silicon substrate 21, and a second conductive silicon-based thin-film 23b is disposed on a rear side of the conductive single-crystalline silicon substrate 21. One of the conductive silicon-based thin-films 23a and 23b is p-type, and the other is n-type. The first conductive silicon-based thin-film 23a is the outermost surface layer 2F on the light-receiving side of the second photoelectric conversion unit 2.

The conductivity-type of the single-crystalline silicon substrate 21 may be either an n-type or a p-type. In comparison between electron and hole, electron has a higher mobility and thus when the silicon substrate 21 is an n-type single-crystalline silicon substrate, the conversion characteristic is particularly high.

The silicon substrate 21 may have morphologies on at least one of the light-receiving surface and the rear surface. Morphologies may be formed on a surface of a silicon substrate by, for example, an anisotropic etching. A tetragonal pyramid-shaped morphology is produced by an anisotropic etching.

From the viewpoint of light incidence, it may be possible that a light-receiving surface of the silicon substrate has a morphology and it may also be possible that each of surfaces of the silicon substrate has a morphology. By forming a morphology such as a texture on a light-receiving surface of the silicon substrate, reflection of light to the first photoelectric conversion unit 1 can be reduced. When the first photoelectric conversion unit 1 is formed by a wet process, the silicon substrate may have a morphology only on the rear side, and the light-receiving surface of the silicon substrate may be flat and have no morphology. When the light-receiving surface of the second photoelectric conversion unit is flat, the first photoelectric conversion unit 1 can be uniformly formed, and generation of pinholes can be reduced. When the silicon substrate has a morphology on the rear surface, a light confinement effect in long-wavelength range can be expected.

The height of morphologies on the surface of the silicon substrate 21 may be 0.5 μm or more, or 1 μm or more. The height of the morphologies may be 3 μm or less, or 2 μm or less. When the height of morphologies is in the above-mentioned range, the reflectance of a surface of the substrate can be reduced to increase a short circuit current. The height of morphologies on the surface of the silicon substrate 21 is determined by a height difference between the peak of the projection and the valley of the recess.

As the conductive silicon-based thin-films 23a and 23b, amorphous silicon, microcrystalline silicon (material including amorphous silicon and crystalline silicon), amorphous silicon alloy and microcrystalline silicon alloy may be used. Examples of the silicon alloy include silicon oxide, silicon carbide, silicon nitride silicon germanium and the like.

Among the above, conductive silicon-based thin-film may be an amorphous silicon thin-film.

When the second photoelectric conversion unit 2 is a heterojunction photoelectric conversion unit, it may be possible that the photoelectric conversion unit includes intrinsic silicon-based thin-films 22a and 22b between the single-crystalline silicon substrate 21 and the conductive silicon-based thin-films 23a and 23b. By providing the intrinsic silicon-based thin-film on the surface of the single-crystalline silicon substrate, surface passivation can be effectively performed while diffusion of impurities to the single-crystalline silicon substrate is suppressed. For effectively performing surface passivation of the single-crystalline silicon substrate 21, the intrinsic silicon-based thin-films 22a and 22b may be intrinsic amorphous silicon thin-films.

The above intrinsic silicon-based thin-films 22a and 22b, and conductive silicon-based thin-films 23a and 23b may be formed by a plasma-enhanced CVD method.

(First Photoelectric Conversion Unit)

An intermediate layer 3 is deposited on the second photoelectric conversion unit 2, and a first photoelectric conversion unit 1 is deposited on the intermediate layer 3. The first photoelectric conversion unit 1 includes a first charge transport layer 12, a light absorbing layer 11 and a second charge transport layer 13 in this order from the light-receiving side. One of the first charge transport layer 12 and the second charge transport layer 13 is a hole transport layer, and the other is an electron transport layer. The second charge transport layer 13 is an outermost surface layer 1R on the rear side in the first photoelectric conversion unit, and is in contact with the intermediate layer 3.

The first photoelectric conversion unit 1 and the second photoelectric conversion unit 2 are connected in series. Thus, when the outermost surface layer 2F (first conductive silicon layer 53a) disposed on the second photoelectric conversion unit 2 on the intermediate layer 3 is a p-type layer the first charge transport layer 12 of the first photoelectric conversion unit 1 is a hole transport layer, and the second charge transport layer 13 is an electron transport layer.

Hereinafter, a configuration of the first photoelectric conversion unit 1 including the electron transport layer 13, the light absorbing layer 11 and the hole transport layer 12 in this order on the intermediate layer 3 (on the light-receiving side) will be described.

As a material of the electron transport layer 13, a known material may be appropriately selected, and examples thereof include titanium oxide, zinc oxide, niobium oxide, zirconium oxide and aluminum oxide. The electron transport layer may contain a donor. For example, when titanium oxide is used for the electron transport layer, examples of the donor include yttrium, europium and terbium.

The electron transport layer 13 may be a dense layer having a smooth structure, or a porous layer having a porous structure. When the electron transport layer has a porous structure, the pore size may be on the nanoscale. The electron transport layer may have a porous structure for increasing the active surface area of the light absorbing layer 11 to obtain an electron transport layer having an excellent electron collecting ability.

The electron transport layer may be a single layer; or may have a stacking configuration with a plurality of layers. For example, the electron transport layer may have a double layer structure in which a dense layer (compact layer) is arranged on the intermediate layer 3-side, and a porous layer is arranged on the light absorbing layer 11-side. The thickness of the electron transport layer may be 1 nm to 200 nm.

The electron transport layer 13 is formed by for example, a spraying method etc. using a solution containing the electron transporting material such as titanium oxide.

The light absorbing layer 11 contains a perovskite-type crystal structure photosensitive material (perovskite crystal material). The compound that forms the perovskite crystal material is represented by, for example, a general formula of $RNH_3MX_3$ or $HCH(NH_2)_2MX_3$. In the formula, R is an alkyl group, may be an alkyl group having 1 to 5 carbon atoms, or a methyl group. M is a divalent metal ion, may be Pb or Sn. X is a halogen, and examples thereof include F, Cl, Br and I. All three Xs may be the same halogen element, or include a plurality of halogens. The spectral sensitivity characteristic can be adjusted by changing the type and ratio of the halogen.

The bandgap of the light absorbing layer 11 in the first photoelectric conversion unit 1 may be 1.55 to 1.75 eV or 1.6 to 1.65 eV for making current matching between the first photoelectric conversion unit 1 and the second photoelectric conversion unit 2. For example, when the perovskite crystal material is represented by the formula $CH_3NH_3PbI_{3-x}Br_x$, x may be about 0 to 0.85 for ensuring that the bandgap is 1.55 to 1.75 eV and x may be about 0.15 to 0.55 for ensuring that the band gap is 1.60 to 1.65 eV.

The light absorbing layer 11 is formed by, for example, a spin coating method etc. using a solution containing the above-mentioned perovskite crystal material.

As a material of the hole transport layer 12, a known material may be appropriately selected, and examples thereof include polythiophene derivatives such as poly-3-hexylthiophene (P3HT) and poly(3,4-ethylenedioxythiophene) (PEDOT), fluorene derivatives such as 2,2',7,7'-tetrakis-(N,N-di-p-methoxyphenylamine)-9,9'-spirobifluorene (Spiro-OMeTAD), carbazole derivatives such as polyvinyl carbazole, triphenylamine derivatives, diphenylamine derivatives, polysilane derivatives and polyaniline derivatives. Examples of the material of the hole transport layer include metal oxides such as $MoO_3$, $WO_3$ and NiO.

The hole transport layer 12 may be a single layer, or may have a stacking configuration with a plurality of layers. The thickness of the hole transport layer may be 1 nm to 100 nm. The hole transport layer 12 is formed by, for example, a spraying method etc. using a solution containing the above-mentioned hole transporting material.

The configuration of the first photoelectric conversion unit 1 and the method for formation thereof are not limited to those described above. For example, each layer that forms the first photoelectric conversion unit may be formed by a vapor deposition or the like.

(Intermediate Layer)

The multi-junction photoelectric conversion device of one or more embodiments of the present invention includes the intermediate layer 3 between the first photoelectric conversion unit 1 and the second photoelectric conversion unit 2. The intermediate layer 3 may be a single layer or a multilayer.

The second charge transport layer 13 provided on an outermost surface of the first photoelectric conversion unit on the rear side has a refractive index of, for example, about 2.3 (in the case of titanium oxide). The conductive semiconductor layer 23a provided on an outermost surface of the second photoelectric conversion unit on the light-receiving side has a refractive index of about 4.3 (in the case of amorphous silicon). When the second charge transport layer of the first photoelectric conversion unit and the first conductive semiconductor layer of the second photoelectric conversion unit are in direct contact with each other, the refractive index difference at the interface of the photoelectric conversion units is large. In particular, when a difference (n2−n1) between the refractive index n1 of the second charge transport layer of the first photoelectric conversion unit 1 and the refractive index n2 of the first conductive semiconductor layer 23a of the second photoelectric conversion unit 2 is 0.7 or more, the reflection loss caused by the refractive index difference markedly increases.

In one or more embodiments of the present invention, the intermediate layer 3 having a specific refractive index and thickness is disposed between the first photoelectric conversion unit 1 and the second photoelectric conversion unit 2, so that the amount of light reaching the second photoelectric conversion unit can be increased to improve the conversion efficiency of the multi-junction photoelectric conversion device.

The average refractive index n of the intermediate layer 3 satisfies n1<n<n2 where n1 is a refractive index of the second charge transport layer 13 of the first photoelectric conversion unit 1, and n2 is a refractive index of the first conductive semiconductor layer 23a of the second photoelectric conversion unit 2. The average refractive index n may be ($\sqrt{(n1 \times n2)}$−0.5)−($\sqrt{(n1 \times n2)}$+0.5), ($\sqrt{(n1 \times n2)}$−0.4)−($\sqrt{(n1 \times n2)}$+0.4), or ($\sqrt{(n1 \times n2)}$−0.3)−($\sqrt{(n1 \times n2)}$+0.3). n may be 2.0 to 3.5, 2.3 to 3.4, or 2.5 to 3.3.

The refractive index of each layer is a refractive index to light having a wavelength of 600 nm, the refractive index being measured by spectroscopic ellipsometry. When the intermediate layer is a multilayer, the average refractive index n is a value obtained in the following manner: the product of the refractive index and the thickness (optical path length) of each layer that forms the intermediate layer 3 is calculated, the products for all the layers are added together, and the resulting value is divided by the total thickness of the intermediate layer. When the charge transport layer 13 of the perovskite photoelectric conversion unit is a porous layer of mesoporous $TiO_2$ or the like, a region where a perovskite crystal material and $TiO_2$ are mixed is present on the light absorbing layer 11 side. Even in this case, the anti-reflection effect of the intermediate layer 3 results mainly from control of the light reflection amount by the refractive index difference at the interface, and therefore the refractive index of $TiO_2$ present at the interface with the intermediate layer may be defined as the refractive index n1 of the charge transport layer 13.

Heretofore, in a thin-film silicon-based multi-junction photoelectric conversion device in which an amorphous silicon thin-film photoelectric conversion unit (top cell) on the light-receiving side and a microcrystalline silicon thin-film photoelectric conversion unit (bottom cell) on the rear side are stacked, the refractive index of an intermediate layer has been controlled to increase the amount of light captured in the top cell and the bottom cell. In the thin-film silicon-based multi-junction photoelectric conversion device, the materials of both the top cell and the bottom cell are silicon, and therefore a light reflecting layer having a low refractive index is provided between the top cell and the bottom cell to increase the amount of light captured in the top cell.

On the other hand, it has been found that when a perovskite photoelectric conversion unit and a crystalline silicon-based photoelectric conversion unit are stacked, light is easily reflected at the junction interface because the refractive index difference between the units is large, and thus the amount of light captured in the crystalline silicon-based photoelectric conversion unit disposed on the rear side is small, so that deterioration of light utilization efficiency, and imbalance of currents between the top cell and the bottom cell easily occur. In one or more embodiments of the present invention, on the basis of an optical design concept opposite to that for the intermediate layer in a conventional multi-junction solar cell using thin-film silicon, the intermediate layer 3 has an intermediate refractive index between the refractive index n1 of the rear-side outermost surface layer 1R of the first photoelectric conversion unit 1 and the refractive index n2 of the light-receiving-side outermost surface layer 2F of the second photoelectric conversion unit 2, so that the amount of light reaching the bottom cell can be increased to improve the conversion efficiency of the multi-junction photoelectric conversion device.

For obtaining the anti-reflection effect of the intermediate layer 3, it may be possible that the refractive index n of the intermediate layer is close to the square root ($\sqrt{(n1 \times n2)}$) of the product of n1 and n2. Further when the optical thickness nd (product of refractive index n and thickness d) of the intermediate layer is a product of a quarter wavelength and an odd number ($(2m-1)\lambda/4$ where m is a natural number), the phase difference between reflected light at an interface of the intermediate layer 3 on the first photoelectric conversion unit 1 side and reflected light at an interface of the intermediate layer 3 on the second photoelectric conversion unit 2 side is $(2m-1)\pi$, so that the former light and the latter light interfere so as to cancel each other. Thus, reflection of light to the first photoelectric conversion unit 1 can be further reduced to increase the amount of light captured in the second photoelectric conversion unit 2.

For matching the photocurrent amount of the first photoelectric conversion unit with the photocurrent amount of the second photoelectric conversion unit, the center wavelength for anti-reflection in the intermediate layer 3 may be in a range of 400 to 1200 nm. Thus, the optical thickness nd of the intermediate layer 3 may be 100 to 300 nm, 125 to 275 nm, or 150 to 250 nm. The thickness of the intermediate layer 3 may be 40 to 80 nm, or 45 to 75 nm.

The thickness of the intermediate layer is determined by transmission electron microscope (TEM) observation of a cross-section. The refractive index and the thickness of each of other layers are measured in the same manner as described above. When a thin-film is formed on a silicon substrate having morphologies, the direction perpendicular to the slope of the irregularities is defined to be a thickness direction.

The material of the intermediate layer 3 is not particularly limited as long as it has the above-mentioned refractive index. The intermediate layer 3 may have a small light absorption over the wavelength range (mainly 500 to 1200 nm) of light that passes through the first photoelectric conversion unit 1 to reach the second photoelectric conversion unit 2. The material of the intermediate layer may be a silicon-based material.

Examples of the silicon-based material having a refractive index in the above-described range include $SiO_x$, $SiC_x$ and $SiN_x$. The refractive index of such a material can be appropriately changed by adjusting the ratio of constituent atoms. In particular, it may be possible to use silicon oxide ($SiO_x$) from the viewpoint of high permeability and high conductivity.

The intermediate layer 3 also has a function of capturing carriers (holes and electrons) generated in the two photoelectric conversion units 1, 2, and recombining the carriers. Therefore, it may be possible that the intermediate layer 3 has a certain degree of conductivity. As long as the material of the intermediate layer, such as microcrystalline silicon oxide, has crystals growing towards the thickness direction, it can act as the intermediate layer even when it has a high sheet resistance, since carriers move mainly towards the thickness direction in the intermediate layer 3. N-type or p-type microcrystalline SiOx may be used as silicon oxide for improving the conductivity of the intermediate layer.

The microcrystalline SiOx layer can be deposited by a plasma. CVD method at a $CO_2/SiH_4$ ratio of 1 or more under so-called microcrystal preparation conditions in which for example, $SiH_4$, $CO_2$ and $H_2$ are used as reaction gases, and the $H_2/SiH_4$ ratio is high (e.g., 10 or more). When the n-type microcrystalline SiOx layer is deposited, it may be possible to use $PH_3$ as a doping gas in addition to the above-mentioned reaction gases. By using $B_2H_6$ in place of $PH_3$ as a doping gas, a p-type microcrystalline SiOx layer can be deposited. Both $PH_3$ and $B_2H_6$ may be used as the doping gas. Deposition by plasma CVD may be performed at a power supply frequency of 10 to 100 MHz, a power density of 50 to 500 $mW/cm^2$, a pressure of 50 to 1500 Pa and a substrate temperature of 150 to 250° C. using, for example, capacitively-coupled parallel plate electrodes. When the $CO_2/SiH_4$ ratio is reduced, the oxygen concentration in the film decreases, so the refractive index can be controlled. By such a deposition method, an SiOx intermediate layer having a desired refractive index and light transmittance and conductivity can be formed.

The intermediate layer 3 may be a multilayer film. The intermediate layer may be, for example, a composite silicon-based thin-film in which the SiOx layer and an n-type microcrystalline silicon layer are stacked. When the intermediate layer includes a plurality of layers, the material that forms each layer is not particularly limited as long as the average refractive index n is in the above-mentioned range. Examples of the material other than the silicon-based material, which forms the intermediate layer, include transparent conductive oxides mainly composed of indium oxide, zinc oxide, tin oxide or the like. Generally, transparent conductive oxide has a refractive index of about 1.9. Therefore, it may be possible that the transparent conductive oxide is stacked with a material having a relatively high refractive index, such as a silicon-based material, when the transparent conductive oxide is used as a material of the intermediate layer. For example, when the intermediate layer is a composite layer having a thin transparent electroconductive layer disposed on a surface of an SiOx layer, an electrical advantage such as a reduction in contact resistance with the photoelectric conversion unit can be expected. When a transparent electroconductive layer is disposed on a surface of a silicon-based material layer such as SiOx, a transparent electroconductive layer may be disposed on either the first photoelectric conversion unit 1-side or the second photoelectric conversion unit 2-side. Transparent electroconductive layers may be disposed on both sides of the silicon-based material layer. When the intermediate layer is a multilayer film, a high anti-reflection effect can be obtained by setting the average refractive index n and the thickness to the same average refractive index n and thickness as in the above-mentioned single layer, although it may be necessary to consider influences of reflection and interference of reflected light at each interface in a strict sense.

(Transparent Electroconductive Layer and Metal Electrode)

A rear surface transparent electroconductive layer 24 may be provided on rear side of the second photoelectric conversion unit. A light-receiving surface transparent electroconductive layer 14 may be provided on light-receiving side of the first photoelectric conversion unit. As a material of the transparent electroconductive layers, conductive oxide, for example, zinc oxide, indium oxide and tin oxide may be used alone or in complex oxide. From the viewpoints of electroconductivity optical characteristics and long-term reliability, indium-based oxides including indium oxide may be used. Among them, those having indium tin oxide (ITO) as a main component are more suitably used. A dopant may be added to the transparent electroconductive layer.

Metal electrodes may be provided on transparent electroconductive layers for effectively extracting photo carriers. The metal electrode 5 on the light-receiving side is formed in a predetermined pattern shape. The metal electrode 6 on the rear side may be formed in a pattern shape, or formed on the entire surface of the transparent electroconductive layer 24. In the embodiment shown in FIG. 1, a pattern shape light-receiving surface metal electrode 5 is disposed on the transparent electroconductive layer 14 on the light-receiving side, and a rear surface metal electrode 6 is formed on the entire surface of the rear side transparent electroconductive layer 24. Examples of the material of the metal electrodes include silver copper and aluminum and the like.

The transparent electroconductive layer and the metal electrode can be formed by a PVD method such as a sputtering method or an ion plating method, a CVD method, a printing method, a plating method, or the like. A PVD method such as a sputtering method or an ion plating method may be used for deposition of a transparent electroconductive layer mainly composed of an indium-based oxide. The patterned metal electrode is formed by printing of a conductive paste, a plating method, or the like.

An example has been described in which the second photoelectric conversion unit 2 is a heterojunction photoelectric conversion unit, the conductive silicon-based thin-film 23a on the light-receiving side is p-type, and the conductive silicon-based thin-film 23b on the rear side is n-type. One or more embodiments of the present invention are not limited to the embodiment shown in FIG. 1. For example, in the second photoelectric conversion unit 2, the conductive silicon-based thin-film 23a on the light-receiving side may be n-type, and the conductive silicon-based thin-film 23b on the rear side may be p-type. In this case, in the first photoelectric conversion unit 1, the first charge transport layer 12 on the light-receiving side is an electron transport layer, and the second charge transport layer 13 on the rear side is a hole transport layer.

The photoelectric conversion device of one or more embodiments of the present invention may be encapsulated by using a encapsulant and modularized when put into practical use. Modularization may be carried out by an appropriate measure. For example, a light-receiving surface metal electrode of a photoelectric conversion device and a rear surface metal electrode of an adjacent photoelectric conversion device are electrically connected through a wiring member to connect adjacent photoelectric conversion devices in series. The photoelectric conversion devices may be connected in parallel. A string with a plurality of photoelectric conversion devices connected through wiring members is encapsulated with encapsulants and glass plates to obtain a photoelectric conversion module.

[Simulation]

The optical effect of the intermediate layer was examined by optical simulation of the multi-junction photoelectric conversion device shown in FIG. 1. In this example, an n-type single-crystalline silicon substrate having no surface morphology was used, and each layer was supposed to be flat. In optical simulation, using the refractive index and the extinction coefficient of each layer, one-dimensional optical calculation was performed to determine the light absorption ratio in the light absorbing layer of each of the first photoelectric conversion unit (perovskite photoelectric conversion unit) and the second photoelectric conversion unit (heterojunction photoelectric conversion unit), and on the basis of the light absorption ratios, the spectral sensitivity current (Jsc) was calculated.

As optical simulation software, "SunShine" from Ljubljana University was used. The refractive index and the extinction coefficient of each material are values measure by a spectroscopic ellipsometer (trade name: M 2000, manufactured by J. A. Woollam Co., Inc.) using a film firmed on a glass plate. Hereinafter a value at a wavelength of 600 nm is described as the refractive index n, but in calculation, the refractive index and the extinction coefficient at each wavelength in a range of 300 to 1200 nm were used.

The layer configuration of the multi-junction photoelectric conversion device in optical simulation was as described below in the order from the light-receiving side.

Air
  Anti-reflection film: $MgF_2$ (refractive index=1.4, thickness=100 nm)
<Light-Receiving Surface Transparent Electroconductive Layer>
  ITO (refractive index=2.0, thickness=60 nm)
<Perovskite Photoelectric Conversion Unit>
  Hole transport layer: Spiro-OMeTAD (refractive index=1.8, thickness=50 nm)
  Light absorbing layer: $CH_3NH_3PbI_3$ (refractive index=2.3, thickness=200 nm)
  Electron transport layer: $TiO_2$ (refractive index=1.5, thickness=10 nm); and $TiO_2$ compact layer (refractive index n1=2.3, thickness=50 nm)
<Intermediate Layer>
  n-type microcrystalline SiOx layer (refractive index n=2.0 to 4.0, thickness d=10 to 100 nm)
<Heterojunction Photoelectric Conversion Unit>
  p-type amorphous silicon thin-film (refractive index n2=4.3, thickness=5 nm)
  Intrinsic amorphous silicon thin-film (refractive index=4.2, thickness=5 nm)
  n-type single-crystalline silicon substrate (refractive index=3.9, thickness=180 μm)
  Intrinsic amorphous silicon thin-film (refractive index=4.2, thickness=5 nm)
  n-type amorphous silicon thin-film (refractive index=4.3, thickness=10 nm)
<Rear Surface Transparent Electroconductive Layer>
  ITO (refractive index=2.0, thickness=50 nm)
<Rear Surface Metal Electrode>
  Ag The refractive index n and the thickness d of the intermediate layer 3 were changed in the above-mentioned structure, and the current density of the heterojunction photoelectric conversion unit and the current density of the perovskite photoelectric conversion unit were calculated for each refractive index and thickness. The rate of change (%) from the current density in the absence of the intermediate layer (when the thickness d of the intermediate layer is 0) was determined. The rate of change of the current density of the heterojunction photoelectric conversion unit is shown in FIG. 2, and the rate of change of the current density of the perovskite photoelectric conversion unit is shown in FIG. 3.

In FIG. 2. mainly in a part surrounded by a solid frame, the current density of the heterojunction photoelectric conversion unit increased as compared to the case where the intermediate layer 3 was not provided. On the other hand, in FIG. 3, mainly in a part surrounded by a solid frame, the current density of the perovskite photoelectric conversion unit decreased as compared to the case where the intermediate layer 3 was not provided. These results show that by adjusting the refractive index n and the thickness d of the intermediate layer, reflection of light to the perovskite photoelectric conversion unit-side is reduced, so that the amount of light captured in the heterojunction photoelectric conversion unit increases.

FIG. 4 shows a difference between the current density of the perovskite photoelectric conversion device and the current density of the heterojunction photoelectric conversion device at the refractive index and thickness of each intermediate reflection layer.

The results shown in FIG. 4 suggest that by adjusting the thickness and the refractive index of the intermediate layer, the difference in current density between the perovskite photoelectric conversion unit and the heterojunction photoelectric conversion unit is decreased to improve current matching, so that energy can be efficiently extracted.

DESCRIPTION OF REFERENCE CHARACTERS 1, 2 photoelectric conversion unit
11 light absorbing layer (perovskite crystal material layer)
12, 13 charge transport layer
21 light absorbing layer (crystalline silicon substrate)
22a, 22b intrinsic silicon-based thin-film
23a, 23b conductive silicon-based thin-film
3 intermediate layer
14, 24 transparent electroconductive layer
5, 6 metal electrode
110 multi-junction photoelectric conversion device Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A multi-junction photoelectric conversion device comprising, in the following order from a light-receiving side:
  a first photoelectric conversion unit;
  an intermediate layer having an average refractive index n of 2.6 to 3.5; and
  a second photoelectric conversion unit,
  wherein the first photoelectric conversion unit comprises:
    a first light absorbing layer comprising a perovskite-type crystal structure photosensitive material;
    a first charge transport layer on the light-receiving side of the first light absorbing layer; and
    a second charge transport layer on a rear side of the first light absorbing layer,
  wherein the second charge transport layer is in contact with the intermediate layer,
  wherein the second photoelectric conversion unit comprises:
    a second light absorbing layer that is a crystalline silicon substrate; and
    a first conductive semiconductor layer that is in contact with the intermediate layer, and
  wherein a refractive index n1 of the second charge transport layer, a refractive index n2 of the first conductive semiconductor layer and an average refractive index n of the intermediate layer satisfy the following relationships:

$n1<n<n2;$ $n2-n1\geq0.7;$ and $\sqrt{(n1\times n2)}-0.5\leq n\leq\sqrt{(n1\times n2)}+0.5.$ 2. The multi-junction photoelectric conversion device according to claim 1, wherein a product of the average refractive index n and a thickness of the intermediate layer is 100 to 300 nm.

3. The multi-junction photoelectric conversion device according to claim 1, wherein the first conductive semiconductor layer is a conductive silicon-based thin-film.

4. The multi-junction photoelectric conversion device according to claim 1, wherein the intermediate layer comprises a silicon oxide layer.

5. The multi-junction photoelectric conversion device according to claim 4, wherein the intermediate layer comprises a microcrystalline silicon oxide layer.

6. The multi-junction photoelectric conversion device according to claim 1, wherein the intermediate layer consists of a single layer.

7. The multi-junction photoelectric conversion device according to claim 1, wherein the first charge transport layer is a hole transport layer, and the second charge transport layer is an electron transport layer.

8. The multi-junction photoelectric conversion device according to claim 1, wherein the second photoelectric conversion unit comprises a second conductive semiconductor layer having a conductivity type different from that of the first conductive semiconductor layer on the rear side of the crystalline silicon substrate.

9. A photoelectric conversion module comprising the multi-junction photoelectric conversion device according to claim 1.

10. A multi-junction photoelectric conversion device comprising, in the following order from a light-receiving side:
a first photoelectric conversion unit;
an intermediate layer having an average refractive index n of 2.6 to 3.5 and a thickness of 40 to 80 nm; and
a second photoelectric conversion unit,
wherein the first photoelectric conversion unit comprises:
a first light absorbing layer comprising a perovskite-type crystal structure photosensitive material;
a first charge transport layer on the light-receiving side of the first light absorbing layer; and
a second charge transport layer on a rear side of the first light absorbing layer,
wherein the second charge transport layer is in contact with the intermediate layer,
wherein the second photoelectric conversion unit comprises:
a second light absorbing layer that is a crystalline silicon substrate; and
a first conductive semiconductor layer that is in contact with the intermediate layer, and
wherein a refractive index n1 of the second charge transport layer, a refractive index n2 of the first conductive semiconductor layer and an average refractive index n of the intermediate layer satisfy the following relationships:

$n1<n<n2;$ $n2-n1\geq0.7;$ and $\sqrt{(n1\times n2)}-0.5\leq n\leq\sqrt{(n1\times n2)}+0.5.$ 11. The multi-junction photoelectric conversion device according to claim 10, wherein a product of the average refractive index n and a thickness of the intermediate layer is 100 to 300 nm.

12. The multi-junction photoelectric conversion device according to claim 10, wherein the first conductive semiconductor layer is a conductive silicon-based thin-film.

13. The multi-junction photoelectric conversion device according to claim 10, wherein the intermediate layer comprises a silicon oxide layer.

14. The multi-junction photoelectric conversion device according to claim 13, wherein the intermediate layer comprises a microcrystalline silicon oxide layer.

15. The multi-junction photoelectric conversion device according to claim 10, wherein the intermediate layer consists of a single layer.

16. The multi-junction photoelectric conversion device according to claim 10, wherein the first charge transport layer is a hole transport layer, and the second charge transport layer is an electron transport layer.

17. The multi-junction photoelectric conversion device according to claim 10, wherein the second photoelectric conversion unit comprises a second conductive semiconductor layer having a conductivity type different from that of the first conductive semiconductor layer on the rear side of the crystalline silicon substrate.

18. A photoelectric conversion module comprising the multi-junction photoelectric conversion device according to claim 10.

* * * * *